United States Patent
Huang

(10) Patent No.: US 10,858,731 B2
(45) Date of Patent: Dec. 8, 2020

(54) INFLATOR AND INFLATION METHOD OF VACUUM ATMOSPHERE CONVERSION CHAMBER, AND VACUUM SPUTTERING EQUIPMENT

(71) Applicant: Shenzhen China Star Optoelectronics Technology Co., Ltd., Guangdong (CN)

(72) Inventor: Qiuping Huang, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 368 days.

(21) Appl. No.: 15/747,574

(22) PCT Filed: Jan. 4, 2018

(86) PCT No.: PCT/CN2018/071268
§ 371 (c)(1),
(2) Date: Jan. 25, 2018

(87) PCT Pub. No.: WO2019/127629
PCT Pub. Date: Jul. 4, 2019

(65) Prior Publication Data
US 2020/0087781 A1    Mar. 19, 2020

(30) Foreign Application Priority Data

Dec. 27, 2017    (CN) .......................... 2017 1 1447671

(51) Int. Cl.
*C23C 14/56*    (2006.01)
*C23C 14/34*    (2006.01)
(Continued)

(52) U.S. Cl.
CPC .............. *C23C 14/56* (2013.01); *C23C 14/34* (2013.01); *C23C 14/54* (2013.01); *F17C 5/06* (2013.01);
(Continued)

(58) Field of Classification Search
CPC ......... C23C 14/34; C23C 14/54; C23C 14/56; C23C 14/562; C23C 14/564; F17C 13/02;
(Continued)

(56) References Cited

FOREIGN PATENT DOCUMENTS

| CN | 1650416 A | 8/2005 |
|----|-----------|--------|
| CN | 101789359 A | 7/2010 |

OTHER PUBLICATIONS

Machine Translation 2004-223316 (Year: 2004).*

* cited by examiner

*Primary Examiner* — Rodney G McDonald
(74) *Attorney, Agent, or Firm* — Hemisphere Law, PLLC; Zhigang Ma

(57) ABSTRACT

An inflator of a vacuum atmosphere conversion chamber is provided. The inflator comprises a first charging pipe including a first valve body, a second charging pipe including a second valve body, a pressure monitoring and judging module, an oxygen concentration monitoring and judging module and a control module. The pressure monitoring and judging module is connected separately to the vacuum atmosphere conversion chamber and the control module, the oxygen concentration monitoring and judging module is connected separately to the vacuum atmosphere conversion chamber and the control module, and the control module is connected separately to the first valve body and the second valve body. An inflation method of vacuum atmosphere conversion chamber and a vacuum sputtering equipment are also provided. The inflator, the inflation method and the
(Continued)

vacuum sputtering equipment can switch the charging gases, for eliminating the safety hazard on the basis of solving the oxidation issue effectively.

8 Claims, 2 Drawing Sheets

(51) Int. Cl.
- *C23C 14/54* (2006.01)
- *F17C 5/06* (2006.01)
- *F17C 13/02* (2006.01)
- *F17C 13/04* (2006.01)

(52) U.S. Cl.
CPC ............ *F17C 13/025* (2013.01); *F17C 13/04* (2013.01); *F17C 2221/014* (2013.01); *F17C 2221/031* (2013.01); *F17C 2250/043* (2013.01); *F17C 2250/0452* (2013.01); *F17C 2250/072* (2013.01); *F17C 2270/05* (2013.01)

(58) Field of Classification Search
CPC ........ F17C 13/025; F17C 13/04; F17C 13/06; F17C 2221/014; F17C 2221/031; F17C 2250/043; F17C 2250/0452; F17C 2250/072; F17C 2270/05
USPC ........................................ 204/298.03, 192.13
See application file for complete search history.

INFLATOR AND INFLATION METHOD OF VACUUM ATMOSPHERE CONVERSION CHAMBER, AND VACUUM SPUTTERING EQUIPMENT

RELATED APPLICATIONS

The present application is a National Phase of International Application Number PCT/CN2018/071268, filed Jan. 4, 2018, and claims the priority of China Application No. 201711447671.2, filed Dec. 27, 2017.

FIELD OF THE DISCLOSURE

The disclosure relates to a field of manufacturing a display panel, and more particularly to an inflator and an inflation method of vacuum atmosphere conversion chamber, and a vacuum sputtering equipment.

BACKGROUND

In current technology, the liquid crystals display (LCD) with advantages such as low radiation, power saving, thin body, etc., has become the mainstream display product, and has been widely used in many products, such as mobile phone, notebook, flat panel television, etc. Following the increasing size of panels, the demand of pixel resolution is also increased. Therefore, more and more production lines use the larger vacuum sputtering equipment. On the one hand, the vacuum sputtering equipment with the features such as large volume, high power, etc., can satisfy the demand to form larger size of films. On the other hand, the demand of reducing conductive wire impedance for products in each production line leads to the increasing thickness of films formed by sputtering, thereby to cause the temperature of metal films increasing rapidly.

For example, when the current vacuum sputtering equipment is applied to sputter copper films, the temperature of substrate would increase to 190 Celsius degrees as the thickness of sputtered copper film increasing to 800 nm, according to the corresponding measured temperature curve. Following the increasing temperature of substrates, it is easy to cause the issues such as the oxidation of sputtered films, uneven due to the temperature, etc., thereby to affect the quality of films and decrease the performance of the equipment.

Besides, for solving the oxidation issue, the current technique is to introduce the non-oxidizing gas for charging. However, when the equipment is exchanged in maintenance work, there is a potential safety hazard for the inspectors to be suffocated.

SUMMARY

For overcoming the above technical issues, the present invention provides an inflator and an inflation method of vacuum atmosphere conversion chamber, and a vacuum sputtering equipment, which can change the charging gases for eliminating the safety hazard on the basis of solving the oxidation issue.

For overcoming the above technical issues, the present invention provides an inflator of a vacuum atmosphere conversion chamber, comprising: a first charging pipe connected to the vacuum atmosphere conversion chamber, wherein the first charging pipe includes a first valve body; a second charging pipe connected to the vacuum atmosphere conversion chamber, wherein the second charging pipe includes a second valve body; a pressure monitoring and judging module, for judging whether a gas pressure inside the vacuum atmosphere conversion chamber is reaching a predetermined pressure value; an oxygen concentration monitoring and judging module, for judging whether an oxygen concentration inside the vacuum atmosphere conversion chamber is reaching a predetermined concentration value; and a control module, for controlling the first valve body and the second valve body to be switching on or off, according to judging signals from the pressure monitoring and judging module and the oxygen concentration monitoring and judging module, wherein the pressure monitoring and judging module is connected separately to the vacuum atmosphere conversion chamber and the control module, the oxygen concentration monitoring and judging module is connected separately to the vacuum atmosphere conversion chamber and the control module, and the control module is connected separately to the first valve body and the second valve body.

In an embodiment, the control module is receiving a charging signal to switch on the first valve body and switch off the second valve body to inject a non-oxidizing gas into the vacuum atmosphere conversion chamber through the first charging pipe; when the value pressure monitoring and judging module judging the gas pressure inside the vacuum atmosphere conversion chamber has reached the predetermined pressure value, the control module is switching off the first valve body and switching on the second valve body to inject a gas including an oxidizing gas into the vacuum atmosphere conversion chamber through the second charging pipe; when the oxygen concentration monitoring and judging module judging the oxygen concentration inside the vacuum atmosphere conversion chamber has reached the predetermined concentration value, the control module is switching off the second valve body.

In an embodiment, the non-oxidizing gas injected through the first charging pipe is nitrogen, the gas injected through the second charging pipe is compressed air.

In an embodiment, the inflator further comprises at least one of a timer and a pressure gauge connected with the control module for sending the charging signal to the control module.

In an embodiment, the pressure monitoring and judging module includes at least one pressure gauge, and the oxygen concentration monitoring and judging module includes at least one oxygen concentration meter.

For overcoming the above technical issues, the present invention provides an inflation method of vacuum atmosphere conversion chamber comprising:

receiving a charging signal, to inject a non-oxidizing gas into the vacuum atmosphere conversion chamber; judging whether a gas pressure inside the vacuum atmosphere conversion chamber is reaching a predetermined pressure value, if a judgement is YES, injecting a gas including an oxidizing gas into the vacuum atmosphere conversion chamber, and if the judgement is NO, continuously injecting the non-oxidizing gas; and judging whether an oxygen concentration inside the vacuum atmosphere conversion chamber is reaching the predetermined concentration value, if a judgement is YES, stopping the inflation, and if the judgement is NO, continuously injecting the gas including the oxidizing gas.

In an embodiment, the inflation method of vacuum atmosphere conversion chamber further comprising stopping the step of injecting the non-oxidizing gas into the vacuum atmosphere conversion chamber when judging the gas pressure inside the vacuum atmosphere conversion chamber has reached the predetermined pressure value.

In an embodiment, the non-oxidizing gas injected is nitrogen, the gas injected is compressed air.

In an embodiment, the charging signal in the step of receiving the charging signal includes at least one of a charging signal from a timer and a charging signal from a pressure gauge.

For overcoming the above technical issues, the present invention provides a vacuum sputtering equipment, comprising: a film advance chamber; a vacuum atmosphere conversion chamber, connected with the film advance chamber; a heating chamber, connected with the vacuum atmosphere conversion chamber; and at least one filming chamber, connected with the heating chamber; wherein the vacuum atmosphere conversion chamber including an inflator. The inflator of the vacuum atmosphere conversion chamber comprises: a first charging pipe connected to the vacuum atmosphere conversion chamber, wherein the first charging pipe includes a first valve body; a second charging pipe connected to the vacuum atmosphere conversion chamber, wherein the second charging pipe includes a second valve body; a pressure monitoring and judging module, for judging whether a gas pressure inside the vacuum atmosphere conversion chamber is reaching a predetermined pressure value; an oxygen concentration monitoring and judging module, for judging whether an oxygen concentration inside the vacuum atmosphere conversion chamber is reaching a predetermined concentration value; and a control module, for controlling the first valve body and the second valve body to be switching on or off, according to judging signals from the pressure monitoring and judging module and the oxygen concentration monitoring and judging module, wherein the pressure monitoring and judging module is connected separately to the vacuum atmosphere conversion chamber and the control module, the oxygen concentration monitoring and judging module is connected separately to the vacuum atmosphere conversion chamber and the control module, and the control module is connected separately to the first valve body and the second valve body.

In an embodiment, the control module is receiving a charging signal to switch on the first valve body and switch off the second valve body to inject a non-oxidizing gas into the vacuum atmosphere conversion chamber through the first charging pipe; when the value pressure monitoring and judging module judging the gas pressure inside the vacuum atmosphere conversion chamber has reached the predetermined pressure value, the control module is switching off the first valve body and switching on the second valve body to inject a gas including an oxidizing gas into the vacuum atmosphere conversion chamber through the second charging pipe; when the oxygen concentration monitoring and judging module judging the oxygen concentration inside the vacuum atmosphere conversion chamber has reached the predetermined concentration value, the control module is switching off the second valve body.

In an embodiment, the non-oxidizing gas injected through the first charging pipe is nitrogen, the gas injected through the second charging pipe is compressed air.

In an embodiment, the vacuum sputtering equipment further comprising: at least one of a timer and a pressure gauge connected with the control module for sending the charging signal to the control module.

The pressure monitoring and judging module includes at least one pressure gauge, and the oxygen concentration monitoring and judging module includes at least one oxygen concentration meter.

The implementations of the inflator and the inflation method of vacuum atmosphere conversion chamber, and the vacuum sputtering equipment have the following advantages. By performing the steps of receiving charging signal to inject the non-oxidizing gas into the vacuum atmosphere conversion chamber; judging whether the gas pressure inside the vacuum atmosphere conversion chamber is reaching a predetermined pressure value, if a judgement is YES, injecting a gas including an oxidizing gas into the vacuum atmosphere conversion chamber; and judging whether the oxygen concentration inside the vacuum atmosphere conversion chamber is reaching the predetermined concentration value, if a judgement is YES, stopping the inflation, it is able to switch the charging gases, for eliminating the safety hazard on the basis of solving the oxidation issue effectively. Besides, the structures of inflator and equipment are simplified, safe and reliable, and easy to maintain.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

Figure 1:
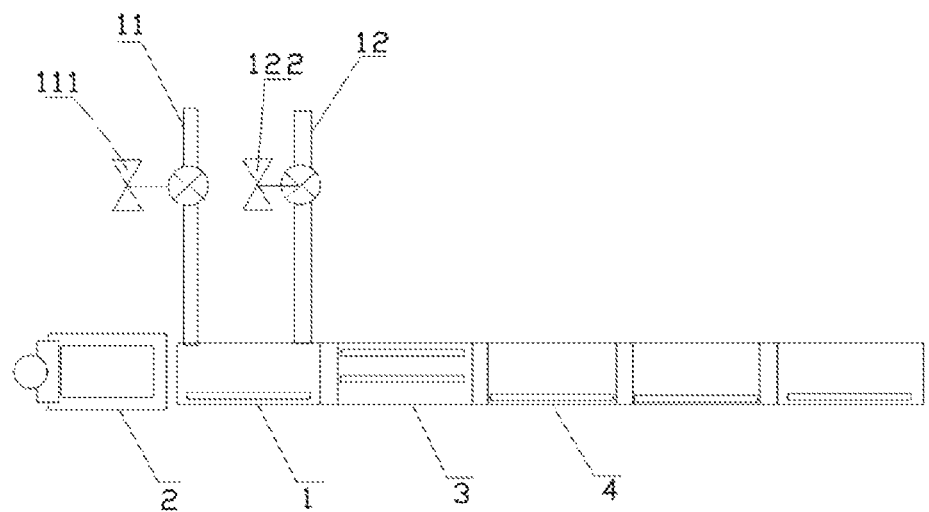
FIG. 1 is a structure view of the vacuum sputtering equipment in an embodiment of the present invention.

Referring to FIG. 1, the structure view of the vacuum sputtering equipment of the present invention is shown.

The vacuum sputtering equipment in this embodiment comprises a film advance chamber 2, a vacuum atmosphere conversion chamber 1 connected with the film advance chamber 2, a heating chamber 3 connected with the vacuum atmosphere conversion chamber 1 and at least one filming chamber 4 connected with the heating chamber 3.

The film advance chamber 2, the vacuum atmosphere conversion chamber 1, the heating chamber 3 and the filming chamber 4, of the vacuum sputtering equipment in this embodiment, all include transfer conveyors disposed therein. The transfer conveyors can be made of an integrated conveyor passing through all the chambers or be made of multiple conveyors disposed separately in each chamber for transferring substrates, and the multiple conveyors are arranged to be able to connect with each other for transferring substrates.

In a specific embodiment, when the film advance chamber 2 is disposing a substrate on a loading device (through the corresponding transfer conveyor) and ready to transfer the substrate into the vacuum atmosphere conversion chamber 1, the anti-vacuum mechanism of the vacuum atmosphere conversion chamber 1 is starting to work for charging the vacuum atmosphere conversion chamber 1 through a pipe. When the inside of the vacuum atmosphere conversion chamber 1 is charged to be at the atmospheric state, a door between the film advance chamber 2 and the vacuum atmosphere conversion chamber 1 is opening, and the substrate is transferred to the transfer conveyor in the vacuum atmosphere conversion chamber 1. Then, the door of the vacuum atmosphere conversion chamber 1 is closed, and the gas-extraction system of the vacuum atmosphere conversion chamber 1 is starting to work, for drawing out the gas in the vacuum atmosphere conversion chamber 1. When the pressure inside the vacuum atmosphere conversion chamber 1 is reaching a predetermined value, the door for entering the heating chamber 3 is opened, and the loading device (through the corresponding transfer conveyor) is transferred to the heating chamber 3, thereby to finish one time of film-advancing operation.

The substrate is sputtered to form films thereon in the filming chamber 4, and then is transferred from the heating chamber 3 to the vacuum atmosphere conversion chamber 1. At this time, the vacuum atmosphere conversion chamber 1 is at vacuum state, and the anti-vacuum mechanism inside the vacuum atmosphere conversion chamber 1 is starting to work for charging the vacuum atmosphere conversion chamber 1 through a pipe. When the inside of the vacuum atmosphere conversion chamber 1 is charged to be at the atmospheric state, the door between the vacuum atmosphere conversion chamber 1 and the film advance chamber 2 is opening, and the substrate is transferred by the loading device to the film advance chamber 2. The operations are repeated alternatively to implement the switch between the vacuum state and the atmospheric state. In this embodiment, the vacuum atmosphere conversion chamber also includes the inflator as depicted below. The structure and operating principle of the inflator is illustrated in detail as follows.

Figure 2:
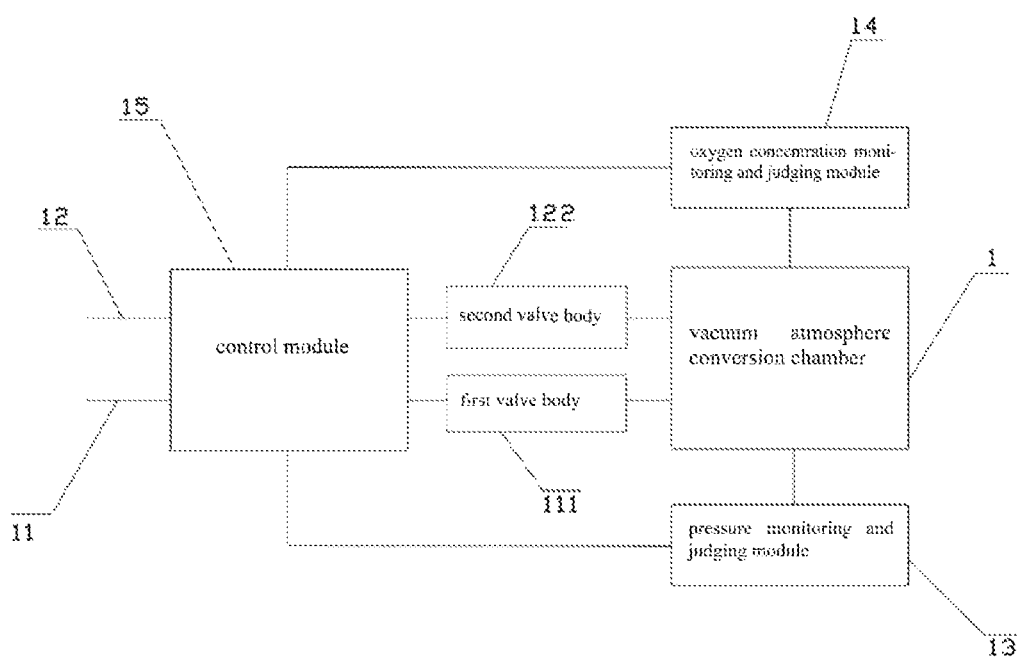
FIG. 2 is a structure view of the inflator of the vacuum atmosphere conversion chamber in an embodiment of the present invention.

Referring to FIG. 2, the inflator of the vacuum atmosphere conversion chamber in an embodiment of the present invention is illustrated.

The inflator of the vacuum atmosphere conversion chamber in this embodiment comprises a first charging pipe 11 connected to the vacuum atmosphere conversion chamber 1 and a second charging pipe 12 connected to the vacuum atmosphere conversion chamber 1. The first charging pipe 11 includes a first valve body 111, and the second charging pipe 12 includes a second valve body 122.

The inflator further comprises a pressure monitoring and judging module 13, for judging whether a gas pressure inside the vacuum atmosphere conversion chamber 1 is reaching a predetermined pressure value, and an oxygen concentration monitoring and judging module 14, for judging whether an oxygen concentration inside the vacuum atmosphere conversion chamber is reaching a predetermined concentration value.

The inflator also comprises a control module 15, for controlling the first valve body 111 and the second valve body 122 to be switching on or off, according to judging signals from the pressure monitoring and judging module 13 and the oxygen concentration monitoring and judging module 14.

In this embodiment, the pressure monitoring and judging module 13 is connected separately to the vacuum atmosphere conversion chamber 1 and the control module 15. The oxygen concentration monitoring and judging module 14 is connected separately to the vacuum atmosphere conversion chamber 1 and the control module 15. The control module 15 is connected separately to the first valve body 111 and the second valve body 122.

When the inflator of the vacuum atmosphere conversion chamber in this embodiment is implemented, the control module 15 is receiving a charging signal to switch on the first valve body 111 and switch off the second valve body 122 to inject a non-oxidizing gas into the vacuum atmosphere conversion chamber 1 through the first charging pipe 11. When the pressure monitoring and judging module 13 judging the gas pressure inside the vacuum atmosphere conversion chamber 1 has reached the predetermined pressure value, the control module 15 is switching off the first valve body 111 and switching on the second valve body 122 to inject a gas including an oxidizing gas into the vacuum atmosphere conversion chamber 1 through the second charging pipe 12. When the oxygen concentration monitoring and judging module 14 judging the oxygen concentration inside the vacuum atmosphere conversion chamber 1 has reached the predetermined concentration value, the control module 15 is switching off the second valve body 122.

According to the above operating principle of the inflator, the substrate formed with copper films thereon is entering the vacuum atmosphere conversion chamber, and the non-oxidizing gas is injected through the first charging pipe 11 into the vacuum atmosphere conversion chamber 1. After the pressure monitoring and judging module 13 judging the gas pressure has reached the predetermined pressure value, the first valve body 111 is switched off and the second valve body 122 is switched on, to replace the charging gas by the gas including the oxidizing gas. After the oxygen concentration monitoring and judging module 14 judging the oxygen concentration has reached the predetermined concentration value, namely reached the security level, the vacuum atmosphere conversion chamber 1 is then to be opened, on the one hand for avoiding of oxidation due to the contact between the copper films on the substrate and oxygen, and on the other hand for preventing form the risk of the operators suffocated due to the high concentration of the non-oxidizing gas.

Preferably, the non-oxidizing gas injected through the first charging pipe 11 is nitrogen, the gas injected through the second charging pipe 12 is compressed air.

Preferably, the inflator further comprises at least one of a timer and a pressure gauge connected with the control module 15 for sending the charging signal to the control module 15.

Preferably, the pressure monitoring and judging module 13 includes at least one pressure gauge, and the oxygen concentration monitoring and judging module 14 includes at least one oxygen concentration meter.

Figure 3:
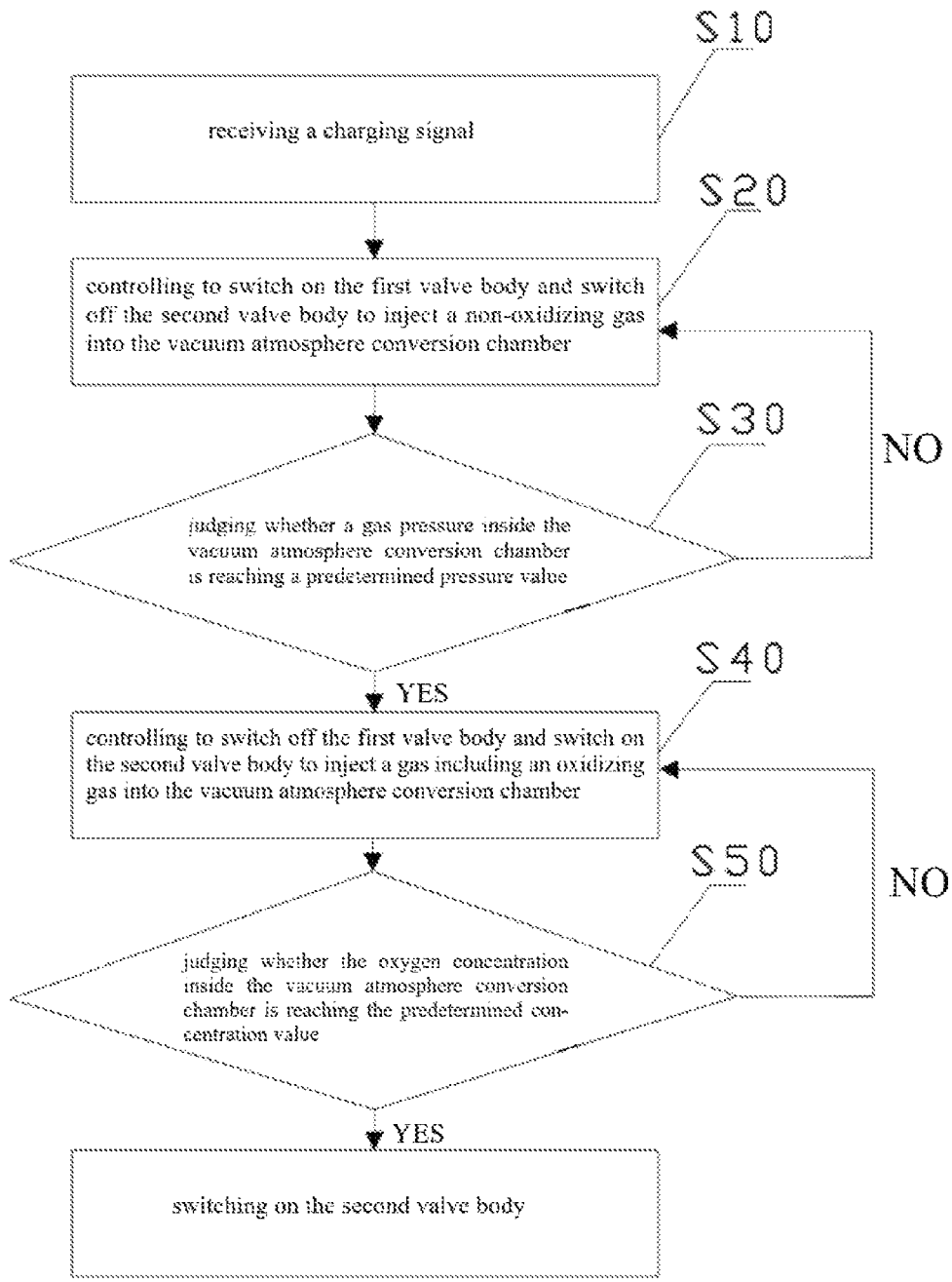
FIG. 3 is a flow chart illustrating an inflation method of vacuum atmosphere conversion chamber in one embodiment of the present invention.

Referring to FIG. 3, an inflation method of vacuum atmosphere conversion chamber in one embodiment of the present invention is illustrated.

In this embodiment, the inflation method of vacuum atmosphere conversion chamber comprises the following steps.

Step S10 is receiving a charging signal.

Step S20 is controlling to switch on the first valve body 111 and switch off the second valve body 122 to inject a non-oxidizing gas into the vacuum atmosphere conversion chamber 1.

Step S30 is judging whether a gas pressure inside the vacuum atmosphere conversion chamber 1 is reaching a predetermined pressure value; if the judgement is YES, executing the next step; and if the judgement is NO, continuously switching on the first valve body 111 and switching off the second valve body 122 to inject the non-oxidizing gas.

Step S40 is controlling to switch off the first valve body 111 and switch on the second valve body 122 to inject a gas including an oxidizing gas into the vacuum atmosphere conversion chamber 1.

Step S50 is judging whether the oxygen concentration inside the vacuum atmosphere conversion chamber 1 is reaching the predetermined concentration value; if the judgement is YES, stopping the inflation; and if the judgement is NO, continuously switching off the first valve body 111 and switching on the second valve body 122.

Further, when judging the gas pressure inside the vacuum atmosphere conversion chamber has reached the predetermined pressure value in the step S30, a step S40 is performed for stopping the step of injecting the non-oxidizing gas into the vacuum atmosphere conversion chamber.

Further, the non-oxidizing gas injected is nitrogen, the gas injected is compressed air.

Further, the charging signal in the step of receiving the charging signal includes at least one of a charging signal from a timer and a charging signal from a pressure gauge.

According to the above operating principle of the inflator, the substrate formed with copper films thereon is entering the vacuum atmosphere conversion chamber, and the non-oxidizing gas is injected through the first charging pipe 11 into the vacuum atmosphere conversion chamber 1. After the pressure monitoring and judging module 13 judging the gas pressure has reached the predetermined pressure value, the first valve body 111 is switched off and the second valve body 122 is switched on, to replace the charging gas by the gas including the oxidizing gas. After the oxygen concentration monitoring and judging module 14 judging the oxygen concentration has reached the predetermined concentration value, namely reached the security level, the vacuum atmosphere conversion chamber 1 is then to be opened, on the one hand for avoiding of oxidation due to the contact between the copper films on the substrate and oxygen, and on the other hand for preventing form the risk of the operators suffocated due to the high concentration of the non-oxidizing gas.

The implementations of the inflator and the inflation method of vacuum atmosphere conversion chamber, and the vacuum sputtering equipment have the following advantages. By performing the steps of receiving charging signal to inject the non-oxidizing gas into the vacuum atmosphere conversion chamber; judging whether the gas pressure inside the vacuum atmosphere conversion chamber is reaching the predetermined pressure value, if the judgement is YES, injecting a gas including an oxidizing gas into the vacuum atmosphere conversion chamber; and judging whether the oxygen concentration inside the vacuum atmosphere conversion chamber is reaching the predetermined concentration value, if the judgement is YES, stopping the inflation, it is able to switch the charging gases, for eliminating the safety hazard on the basis of solving the oxidation issue effectively. Besides, the structures of inflator and equipment are simplified, safe and reliable, and easy to maintain.

What is claimed is:

1. An inflator of a vacuum atmosphere conversion chamber, comprising:
    a first charging pipe connected to the vacuum atmosphere conversion chamber, wherein the first charging pipe includes a first valve body;
    a second charging pipe connected to the vacuum atmosphere conversion chamber, wherein the second charging pipe includes a second valve body;
    a pressure monitoring and judging module, for judging whether a gas pressure inside the vacuum atmosphere conversion chamber is reaching a predetermined pressure value;
    an oxygen concentration monitoring and judging module, for judging whether an oxygen concentration inside the vacuum atmosphere conversion chamber is reaching a predetermined concentration value; and
    a control module, for controlling the first valve body and the second valve body to be switching on or off, according to judging signals from the pressure monitoring and judging module and the oxygen concentration monitoring and judging module,
    wherein the pressure monitoring and judging module is connected separately to the vacuum atmosphere conversion chamber and the control module, the oxygen concentration monitoring and judging module is connected separately to the vacuum atmosphere conversion chamber and the control module, and the control module is connected separately to the first valve body and the second valve body;
    wherein the control module is receiving a charging signal to switch on the first valve body and switch off the second valve body to inject a non-oxidizing gas into the vacuum atmosphere conversion chamber through the first charging pipe;
    when the value pressure monitoring and judging module judging the gas pressure inside the vacuum atmosphere conversion chamber has reached the predetermined pressure value, the control module is switching off the first valve body and switching on the second valve body to inject a gas including an oxidizing gas into the vacuum atmosphere conversion chamber through the second charging pipe;
    when the oxygen concentration monitoring and judging module judging the oxygen concentration inside the vacuum atmosphere conversion chamber has reached the predetermined concentration value, the control module is switching off the second valve body.

2. The inflator of the vacuum atmosphere conversion chamber according to claim 1, wherein the non-oxidizing gas injected through the first charging pipe is nitrogen, the gas injected through the second charging pipe is compressed air.

3. The inflator of the vacuum atmosphere conversion chamber according to claim 1, further comprising: at least one of a timer and a pressure gauge connected with the control module for sending the charging signal to the control module.

4. The inflator of the vacuum atmosphere conversion chamber according to claim 1, wherein the pressure monitoring and judging module includes at least one pressure gauge, and the oxygen concentration monitoring and judging module includes at least one oxygen concentration meter.

5. A vacuum sputtering equipment, comprising:
    a film advance chamber;
    a vacuum atmosphere conversion chamber, connected with the film advance chamber;
    a heating chamber, connected with the vacuum atmosphere conversion chamber; and
    at least one filming chamber, connected with the heating chamber;

wherein the vacuum atmosphere conversion chamber including an inflator, and the inflator of the vacuum atmosphere conversion chamber comprises:

a first charging pipe connected to the vacuum atmosphere conversion chamber, wherein the first charging pipe includes a first valve body;

a second charging pipe connected to the vacuum atmosphere conversion chamber, wherein the second charging pipe includes a second valve body;

a pressure monitoring and judging module, for judging whether a gas pressure inside the vacuum atmosphere conversion chamber is reaching a predetermined pressure value;

an oxygen concentration monitoring and judging module, for judging whether an oxygen concentration inside the vacuum atmosphere conversion chamber is reaching a predetermined concentration value; and a control module, for controlling the first valve body and the second valve body to be switching on or off, according to judging signals from the pressure monitoring and judging module and the oxygen concentration monitoring and judging module, wherein the pressure monitoring and judging module is connected separately to the vacuum atmosphere conversion chamber and the control module, the oxygen concentration monitoring and judging module is connected separately to the vacuum atmosphere conversion chamber and the control module, and the control module is connected separately to the first valve body and the second valve body, wherein the control module is receiving a charging signal to switch on the first valve body and switch off the second valve body to inject a non-oxidizing gas into the vacuum atmosphere conversion chamber through the first charging pipe;

when the value pressure monitoring and judging module judging the gas pressure inside the vacuum atmosphere conversion chamber has reached the predetermined pressure value, the control module is switching off the first valve body and switching on the second valve body to inject a gas including an oxidizing gas into the vacuum atmosphere conversion chamber through the second charging pipe;

when the oxygen concentration monitoring and judging module judging the oxygen concentration inside the vacuum atmosphere conversion chamber has reached the predetermined concentration value, the control module is switching off the second valve body.

6. The vacuum sputtering equipment according to claim 5, wherein the non-oxidizing gas injected through the first charging pipe is nitrogen, the gas injected through the second charging pipe is compressed air.

7. The vacuum sputtering equipment according to claim 5, further comprising: at least one of a timer and a pressure gauge connected with the control module for sending the charging signal to the control module.

8. The vacuum sputtering equipment according to claim 5, wherein the pressure monitoring and judging module includes at least one pressure gauge, and the oxygen concentration monitoring and judging module includes at least one oxygen concentration meter.

* * * * *